United States Patent [19]

Nishibayashi et al.

[11] Patent Number: 5,500,077
[45] Date of Patent: Mar. 19, 1996

[54] METHOD OF POLISHING/FLATTENING DIAMOND

[75] Inventors: Yoshiki Nishibayashi; Shinichi Shikata, both of Itami, Japan

[73] Assignee: Sumitomo Electric Industries, Ltd., Japan

[21] Appl. No.: 208,169

[22] Filed: Mar. 8, 1994

[30] Foreign Application Priority Data

Mar. 10, 1993 [JP] Japan .................................. 5-049198
May 28, 1993 [JP] Japan .................................. 5-127230

[51] Int. Cl.$^6$ ............................................ B44C 1/22
[52] U.S. Cl. .................... 156/628.1; 156/632.1; 156/630.1; 156/643.1
[58] Field of Search ........................ 156/628.1, 632.1, 156/630.1, 643.1; 117/929

[56] References Cited

U.S. PATENT DOCUMENTS

| | | | |
|---|---|---|---|
| 4,935,303 | 6/1990 | Ikoma | 428/408 |
| 4,975,265 | 12/1990 | Hed | 423/579 |
| 5,186,973 | 2/1993 | Garg | 427/590 |
| 5,204,210 | 4/1993 | Jansen | 430/198 |

FOREIGN PATENT DOCUMENTS

| | | | |
|---|---|---|---|
| 64-68484 | 3/1989 | Japan . | |
| 64-62484 | 3/1989 | Japan . | |
| 2-26900 | 1/1990 | Japan . | |
| 3-24774 | 4/1991 | Japan . | |
| 245645 | 5/1991 | Japan | 117/929 |
| 3-76169 | 6/1991 | Japan . | |
| 5-102068 | 8/1993 | Japan . | |

OTHER PUBLICATIONS

Silicon Processing for the VLSI ERA, vol. 1–Process Technology, S. Wolf and R. N. Tauber, Lattice Press, 1986, pp. 430–431.
Patent Abstracts of Japan, vol. 13, No. 260 (c–207) (3608) Jun. 1989 & JP–A–01 062 484 (Seiko Instr. & Electronics Ltd.) Mar. 1989.
Patent Abstracts of Japan, vol. 18, No. 8 (E–1486) Jan. 1994 & JP–A–05 251 586 (Seiko Epson Corp.) Sep. 1993.
Patent Abstracts of Japan, vol. 17, No. 625 (E–1461) Nov. 1993, & JP–A–05 198 504 (Seiko Epson Corp.) Aug. 1993.
Applied Physics Letters, vol. 61, No. 19, Nov. 1992, New York US, pp. 2326–2328, Grot "Oxygen based electron cyclotron resonance etching of semiconducting homoepitaxial diamond films", p. 2326.
Diamond and Related Materials, vol. 1, No. 9, Sep. 1992, Amsterdam NL, pp. 949–953, Jin et al. "Polishing of cvd diamond by diffusional reaction with manganese powder", pp. 952–953.

*Primary Examiner*—R. Bruce Breneman
*Assistant Examiner*—Joni Y. Chang
*Attorney, Agent, or Firm*—Pennie & Edmonds

[57] ABSTRACT

A method of flattening diamond, including: forming a flat coating comprising a material different from diamond, on a surface of diamond having unevenness; and removing the coating and the unevenness of the surface of diamond by dry etching under a condition such that both of the coating and the diamond can be etched, thereby to smooth the surface of the diamond.

17 Claims, 7 Drawing Sheets

METHOD OF POLISHING/FLATTENING DIAMOND

BACKGROUND OF THE INVENTION

1. Field of the Invention

The present invention relates to a method of polishing and/or flattening single crystal (monocrystal) or polycrystal diamond, and particularly to a method of polishing and/or flattening diamond so as to provide a diamond substrate having a surface such that it is applicable to various elements, devices and instruments such as cutting instruments, wear resisting instruments, surface acoustic wave (SAW) devices, semiconductor devices, large-area heat sink and diamond lenses.

2. Related Background Art

Diamond not only has an excellent light transmitting property over a wide wavelength range extending from an infrared region to an ultraviolet region except for a part of the infrared region, but also has an excellent pressure resistance, and further diamond is the hardest material among all materials which are present on the earth. Therefore, diamond is the best material for optical use because it is substantially free from scratches.

Further, diamond has the highest Young's modulus among all the materials, so that when a surface acoustic wave is induced, the wave is propagated through diamond at a very high speed. Therefore, diamond has attracted much attention as a material applicable to a high-frequency band-pass filter to be used for a vehicular communication system, etc., and the application thereof is under investigation.

Further, diamond has the largest thermal conductivity among all the materials, and therefore the application thereof to a heat sink for a device such as semiconductor laser and IC has also been investigated.

Moreover, it has been attracted much attention to apply diamond to a material for a device which is stably operable under severe environmental conditions, e.g., at high temperature, under radiation, etc., or is durably operative even at a high output.

A reason for the operativeness of diamond at a high temperature is its band gap as large as 5.5 eV. In other words, intrinsic range, i.e., a temperature range where carriers of semiconductor diamond cannot be controlled is absent at 1400° C. or below.

As a process for artificially synthesizing diamond, an ultra-high pressure synthesizing method has heretofore been employed, but recently diamond crystal has also been synthesized by use of a vapor-phase synthesizing method. Under these circumstances, the application of diamond to optical materials, semiconductor materials, etc., has increasingly been expected.

Recently, in a case where diamond is applied to a surface acoustic wave device, a semiconductor device, a heat sink for various devices or the like, diamond is desired to provide a material having a large area as compared with that in the prior art and having a mirror surface property and/or flatness which is suitable for ultra-fine microfabrication.

However, the surface of artificial diamond produced by the ultra-high pressure synthesizing method or vapor-phase synthesizing method generally has a considerably large roughness of about 1000 μm. Accordingly, in such a case, it is necessary to polish the diamond so as to provide a flat surface.

However, as described above, diamond is the hardest material among all the materials, and it is not easy to polish diamond so as to provide a flat surface.

Heretofore, the surface of diamond has mainly been polished by using machining (or mechanical process).

Specific examples of such machining include a skiving polishing method wherein a surface of diamond having unevenness is subjected to rough machining by using a physical means such as a grinding machine, then it is polished by using abrasive particles of diamond, and then a diamond component present at the uneven portion on the diamond surface is fused by high-speed friction at a high temperature, thereby to flatten the surface of the diamond.

The conventional polishing method as described above can provide a relatively good mirror surface. However, this method is based on polishing due to direct contact, and therefore the resultant polishing performance largely depends on various conditions or states of a material or substrate to be polished, such as kind of the material, degree of warp, area, thickness of the substrate.

For example, in the case of a diamond film formed on a thin-film silicon substrate, as the area of the diamond film is increased, the warp becomes remarkable, and the degree of the warp may reach several tens of microns in some cases. Accordingly, in such a case, when mechanical pressure is applied to the substrate through the contact polishing, the substrate can be broken. As described above, in the case of the mechanical polishing, there is a certain limit to the dimension or size of a polishing apparatus and a polishing plate, the thickness of a diamond substrate to be polished, etc., and therefore the diamond film which can be subjected to mechanical polishing is practically restricted to one having a small size. Accordingly, it is difficult to mechanically polish a diamond film formed on a large-area (or large-size) substrate.

Japanese Laid-open Patent Application (KOKAI) No. Hei 2-26900 (i.e., No. 26900/1990) discloses a method wherein a metal such as iron is used as a polishing material and a layer of diamond reacted with iron is removed. However, this method still uses a contact-type polishing apparatus, and therefore the above-mentioned problems encountered in the contact polishing are not solved yet.

On the other hand, Japanese Laid-open Patent Application No. Sho 64-68484 (i. e., No. 68484/1989) discloses a method wherein an ion beam, etc., is provided to a surface of diamond in a non-contact mode thereby to flatten the surface of the diamond. The mirror surface property of the diamond can be improved by using such a method. However, the resultant smoothness is decidedly inferior to that obtainable by the contact polishing as described above, and it is impossible to apply the resultant diamond film smoothed by this method to microfabrication, etc.

Japanese Laid-open Patent Application No. 64-62484 (i. e., 62484/1989) discloses a similar method wherein an amorphous carbon film, which is similar to diamond film, is formed on a diamond film by using a CVD (chemical vapor deposition) process, and then the resultant product is subjected to an "etchback" treatment (i.e., the resultant diamond is subjected to etching from the side of the flat amorphous carbon film formed by the above-mentioned manner). However, the diamond surface provided by this method has a considerably large roughness, and sufficient flatness can hardly be obtained. Accordingly, it is difficult to apply the thus provided diamond film to microfabrication. Further, in this method, the formation of the amorphous carbon film having a relatively large thickness consumes a long period of time, and therefore this method is not desirable in view of the production cost.

SUMMARY OF THE INVENTION

An object of the present invention is to provide a method of polishing/flattening diamond which has solved the problems as described above.

Another object of the present invention is to provide a method of polishing/flattening diamond which is capable of providing a surface of diamond on which a microstructure such as fine line or wiring can stably be formed, in a short period of time.

A further object of the present invention is to provide a method of polishing/flattening diamond which is capable of providing a mirror surface of diamond in a non-contact manner substantially regardless of various states or conditions of a substrate to be polished or flattened, such as material, degree of warp, area and thickness of the substrate.

A further object of the present invention is to provide a method of polishing/flattening diamond which can provide a surface of diamond capable of being subjected to microfabrication (particularly, ultra-fine microfabrication), at a low cost.

According to the present invention, there is provided a method of flattening diamond, comprising:

forming a flat coating comprising a material different from diamond, on a surface of diamond having unevenness; and removing the coating and the unevenness of the surface of diamond by dry etching under a condition such that both of the coating and the diamond can be etched, thereby to smooth the surface of the diamond.

The present invention also provides a method of polishing diamond, comprising:

dropping a liquid coating agent comprising a material different from diamond on a surface of diamond having unevenness, and hardening the coating agent to form a coating having a spherical surface on the surface of the diamond; and removing the coating and the unevenness of the surface of diamond by dry etching under a condition such that both of the coating and the diamond can be etched, thereby to provide a spherical surface of diamond.

The present invention further provides a method of flattening diamond, comprising:

a first step of forming a flat coating comprising a material different from diamond on a surface of diamond;

a second step of subjecting the diamond to ion implantation through the medium of the coating to denature a portion of the diamond; and a third step of removing the coating and removing the denatured portion from the diamond.

In the above-mentioned diamond flattening method, the above first to third steps may be repeated as desired, so that the resultant flatness of the diamond surface may further be improved.

Further objects and advantages of the present invention will be apparent from the description of the preferred embodiments with the accompanying drawings.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF PREFERRED EMBODIMENTS (Diamond)

Figure 1:
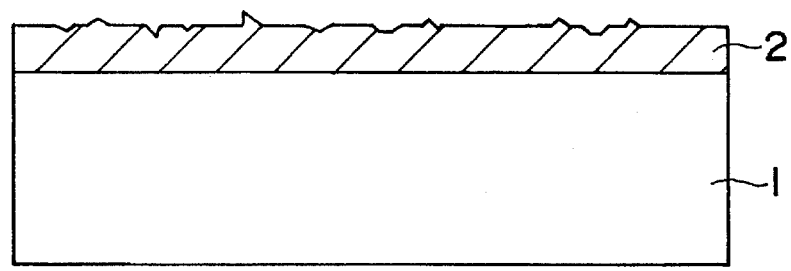
FIGS. 1–3 are schematic sectional views showing an embodiment of a method of polishing diamond according to the present invention.

The kind of diamond usable in the present invention are not particularly restricted. More specifically, the polishing and/or flattening method according to the present invention is applicable to various kinds of diamond so as to flatten and/or polish a surface thereof. Specific examples of such diamond may include: natural diamond, diamond comprising bulk single crystal which is artificially produced by using a high-pressure synthesizing method, diamond comprising thin-film polycrystal or thin-film single crystal which is artificially formed on a predetermined substrate, etc., by using a vapor-phase synthesizing method, etc.

(Coating)

The coating (or thin film) to be formed on a surface of diamond for the purpose of flattening or polishing the surface of diamond may be formed by using one or more materials selected from various materials other than diamond. In addition, such a coating may be formed by using various process. Specific examples of the above-mentioned process may include: a method wherein a liquid coating material comprising a material other than diamond is applied to a surface of diamond so as to fill or occupy the unevenness of the surface of the diamond, and the resultant coating is solidified or hardened, e.g., by evaporation of a solvent constituting the liquid coating material; a method (i.e., a sol-gel process) wherein a coating material in a sol state is applied to a surface of diamond, and the resultant coating is converted into a gel state to be solidified thereby to form a flat surface; etc. In this manner, a coating may be formed relatively easily for the purpose of flattening (i.e., for the purpose of forming a coating having a flat surface).

When the coating is formed by using a liquid material, it is preferred that an appropriate amount of the liquid material is dropped onto a surface of diamond to be flattened, and the coating material is subjected to spin coating (rotational coating) by using a spinner or the like.

In the present invention, the material other than diamond to be used for forming a coating may preferably be one which is capable of forming a relatively stable surface having substantially no unevenness. Specific examples of such a material may include: one comprising, as a main component, an organic material containing silicon (Si), boron (B) or the like; and one comprising, as a main component, an inorganic material containing silicon (Si), boron (B) or the like.

As the material for coating formation which mainly comprises an inorganic material containing Si, B, etc., may include an inorganic silicon compound, an inorganic boron compound, etc. For example, when a coating comprising an inorganic silicon compound or inorganic boron compound is formed in accordance with a sol-gel process, a sol of $SiO_2$-type or $B_2O_3$-type, etc., is applied onto a surface of diamond by spin coating by use of a spinner or the like, and then the resultant sol layer is converted, e.g., under heating, to form a gel layer. In this case, an $SiO_2$-type coating liquid to be used in a semiconductor device fabrication process may easily be used.

As the material for coating formation which mainly comprises an organic material, for example, a relatively inexpensive polyimide material to be used in a semiconductor device fabrication process may easily be used. However, the material usable in the present invention is not restricted to such a polyimide material, but may be at least one selected from other organic polymers.

The material mainly comprising an organic material containing Si, B or the like may preferably be a liquid photoresist such as water-soluble colloid type, polycinnamic acid type, cyclized rubber type and quinone diazide type.

(Dry etching)

In the present invention, reactive ion etching (RIE) may particularly preferably be used as a dry etching process. In addition, the dry etching process may also be another process such as plasma etching and ion beam etching. Similar smoothing effect may be provided by using any of these etching processes.

The gas to be used in the dry etching may be one or a mixture of two or more species selected from ordinary etching gases such as Ar, He, $CF_4$, $CHF_3$, $SF_6$, $BCl_3$ and $CHCl_3$. There may also be used a mixture comprising at least one etching gas as described above and a small amount of $O_2$, $N_2O$, $N_2$ or the like.

In the present invention, the condition under which both of the coating and diamond are capable of being etched may basically be provided by reducing the etching selectivity ratio between the coating and diamond, i.e., ratio of (etching rate for coating)/(etching rate for diamond), at the time of the dry etching. In the present invention, the etching selectivity ratio may preferably be in a range of 1:2 to 2:1. It is further preferred that the etching selectivity ratio is substantially equal to 1:1 (i.e., in a range of 0.8:1 to 1:0.8, particularly preferably 0.9:1 to 1:0.9).

For example, When the dry etching is conducted by using a gas system comprising Ar mixed with $O_2$, the etching selectivity ratio between the coating and diamond may be adjusted to substantially 1:1 by regulating the amount of $O_2$ added to Ar to about 0 to 10% (based on volume or flow rate).

(Ion implantation)

In the present invention, ion implantation may easily be conducted in accordance with an ordinary ion implantation technique.

The element to be used for the ion implantation is not particularly restricted, and any element can appropriately be used. The ion to be used for such a purpose may preferably be one having such a sufficient mass that the crystal state (or crystal structure) of diamond is destroyed on the basis of the ion implantation to denature the diamond, and having such a size that it is deeply introduced into the diamond at the time of the ion implantation. More specifically, Ar, Ne, He, Al, Xe, Cu or the like may preferably be used for such a purpose.

In the present invention, the coating may be formed on the diamond so that the stopping cross section of the diamond with respect to the implanted ions (A) is substantially equal to the stopping cross section of the coating with respect to the implanted ions (B), at the time of the ion implantation process. More specifically, the ratio of the above-mentioned stopping cross section B/A may preferably be $0.1 \leq B/A \leq 10$, more preferably $0.9 \leq B/A \leq 1.1$.

The "stopping cross section" used herein is defined as a value (quotient) obtained by dividing the loss energy of the implanted ions by the number of atoms or molecules per unit volume, where the loss energy is a quantity of energy which is lost from the implanted ions based on the interaction between the coating or diamond, and the implanted ions penetrating the coating or diamond. When the stopping cross section of the diamond to the implanted ions is made substantially equal to the stopping cross section of the coating to the implanted ions, the range (i.e., the distance that an ionizing particle can penetrate a medium before its energy drops to the point that the particle no longer produces ionization) of the implanted ions introduced into the diamond can be made equal to the range of the implanted ions introduced into the coating, with high reproducibility.

The stopping cross section of the coating to the implanted ions can be relatively easily adjusted by adding an appropriate amount of a metal element to a material to be used for the formation of the coating, and homogeneously mixing the metal element and the material.

Preferred examples of the metal element to be added for such a purpose may include Mg, Al, Ti, W, Mo, Au, Pt, etc. The amount of the metal element can be determined by computer simulation on the basis of the material constituting the coating, the kind of the implanted ion and the kind of the metal element to be added to the coating material.

(Removal of coating)

In the present invention, the coating may be removed by using a removing process which may appropriately be selected from various processes such as a chemical and/or a physical etching process in accordance with the material constituting the coating, and a chemical treatment using a removing agent, HF (hydrofluoric acid), etc.

(Removal of denatured portion of diamond)

In the present invention, the denatured portion of the diamond may be removed by using a dry etching process or a chemical wet etching process. Similar effect may be obtained by using any of etching processes as described above.

The dry etching process to be used for such a purpose may preferably be a plasma etching process using gas discharge employing a gas such as hydrogen, oxygen and halogen. On the other hand, the wet etching process may preferably be an etching process using chromic acid treatment.

(Degree of flattening or polishing)

In the present invention, the resultant smoothness (or roughness) of a surface of diamond may for example be evaluated on the basis of $R_{Max}$ or $R_a$ (surface roughness according to Japanese Industrial Standard (JIS) B 0601-1970). More specifically, when the $R_{Max}$ of a surface of diamond before flattening or polishing is denoted by C (μm) and the $R_{Max}$ Of the surface of diamond after the flattening or polishing is denoted by D (μm), in the present invention, the ratio of (D/C) may preferably be not more than 1/3, more preferably not more than 1/5 (particularly preferably, not more than 1/10).

(Method of polishing diamond)

An embodiment of the method of polishing diamond according to the present invention and a mechanism thereof will be described with reference to FIGS. 1–3.

In this method of polishing diamond, as shown in FIG. 1, a synthetic diamond film 2 formed on a predetermined substrate 1 (e.g., a silicon substrate) is provided. In general, the diamond film 2 has a certain unevenness (roughness) on the entire surface thereof. In this step, a flat coating comprising a material other than diamond is formed on such a surface of the diamond film 2.

Figure 2:
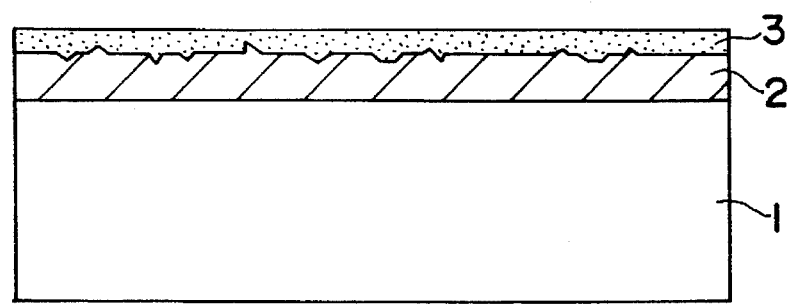

On the basis of the formation of the coating, the uneven portion over the entire surface of the diamond 2 is covered with the coating 3 as shown in FIG. 2, and pits or concavities constituting the surface unevenness are filled or occupied with the material of the coating 3. As a result, the coating 3 having a flat surface is formed substantially regardless of the unevenness of the surface of the diamond film 2.

Then, the resultant product is subjected to a dry etching process from the side of the coating 3 having a substantially flat surface, under an etching condition such that both of the coating 3 and the diamond 2 can be etched in an atmosphere comprising a predetermined gas (e.g., under a condition such that the etching selectivity ratio between the coating 3 and the diamond 2 is substantially equal to 1:1), in such a manner that the etching is started from the flattened surface of the coating 3.

Through the above-mentioned process, while high flatness is substantially maintained, the coating 3 is first removed, and then both of the coating 3 and the uneven portion of the surface of the diamond 2 are removed from the substrate 1 (e.g., in a simultaneous manner), thereby to smooth the surface of the diamond 2.

Figure 3:
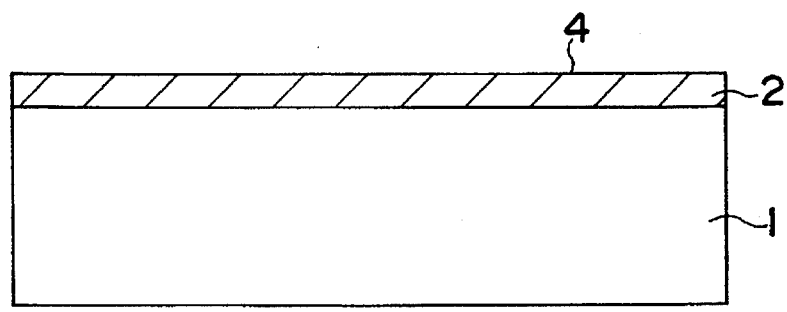

As a result, as shown in FIG. 3, the coating 3 and most of the uneven portion which have been present on the entire surface of the diamond 2 are finally removed, and a flat and mirror-finished surface 4 of the diamond 2 may be provided.

Another embodiment of the method of polishing diamond will be described with reference to FIGS. 4 and 5.

Figure 4:
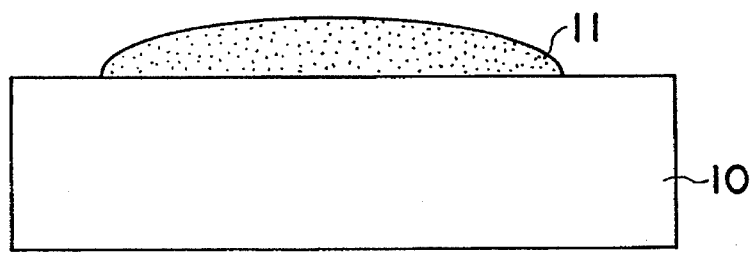
FIGS. 4 and 5 are schematic sectional views showing another embodiment of a method of polishing diamond according to the present invention.

First, as shown in FIG. 4, a substrate 10 comprising diamond is provided. The diamond substrate 10 usually has unevenness on the surface thereof. A liquid coating agent comprising a material other than diamond is dropped onto the entire surface of the substrate comprising the diamond 10 and then the coating agent is hardened, thereby to form a coating 11 having a spherical surface.

Through this process, the unevenness which has been present on the surface of the diamond substrate 10 is covered with the coating 11, and pits constituting the unevenness are filled with the material of the coating 11. As a result, the coating 11 having a smooth surface may be formed substantially regardless of the degree of the unevenness of the surface of the diamond substrate 10.

Then, the resultant product is subjected to a dry etching process from the side of the spherical surface of the coating 11, under an etching condition such that both of the coating 11 and the diamond 10 can be etched in an atmosphere comprising a predetermined gas (e.g., under a condition such that the etching selectivity ratio between the coating 11 and the diamond 10 is substantially equal to 1:1), in such a manner that the etching is started from the spherical surface of the coating 11.

Through the above-mentioned process, the coating 11 is first removed, and then both of the coating 11 and the uneven portion of the surface of the diamond 10 are removed from the diamond substrate 10 (e.g., in a simultaneous manner), thereby to provide a spherical polished surface of the diamond 10.

Figure 5:
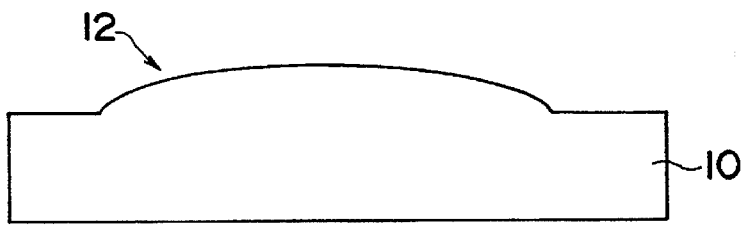

As a result, as shown in FIG. 5, a diamond lens 12 having a spherically polished surface of diamond may finally be provided.

Figure 8:
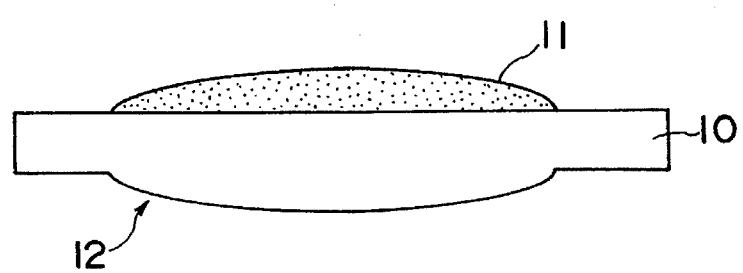
FIGS. 8 and 9 are schematic sectional views showing a further embodiment of a method of polishing diamond according to the present invention.
Figure 9:
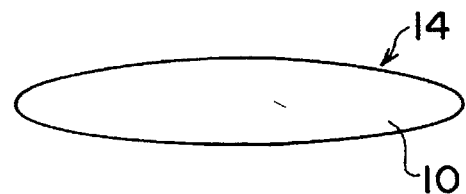

When the back surface of the diamond substrate 10 is also polished in the same manner as described above, as shown in FIG. 8, a diamond lens 14 having both surfaces which have been spherically polished may be provided as shown in FIG. 9.

Next, an embodiment of the method of flattening diamond according to the present invention and a mechanism thereof will be described with reference to FIGS. 10–15.

Figure 10:
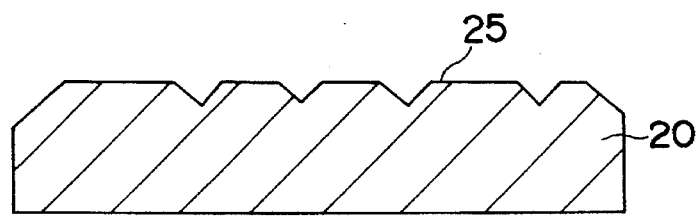
FIGS. 10–15 are schematic sectional views showing an embodiment of a method of flattening diamond according to the present invention, in the order of steps constituting the flattening method.

In this embodiment of the diamond flattening method, a coating 30 comprising a material other than diamond and having a flat surface is formed on a surface 25 of diamond 20 as shown in FIG. 10.

Figure 11:
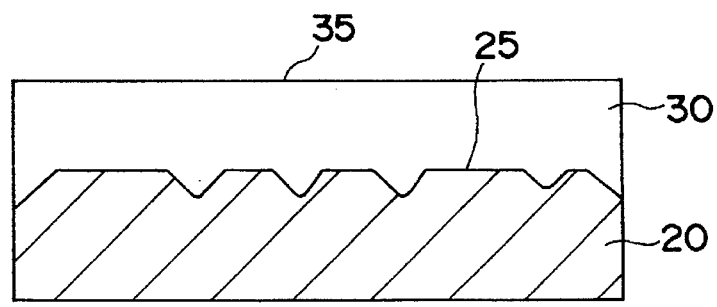

Through this process, as shown in FIG. 11, unevenness which has been present on the surface 25 of the diamond 20 is covered with the coating 30 and pits constituting the unevenness are filled with the material of the coating 30, thereby to provide a flat coating surface 35. Here, the coating 30 may be formed so as to have a flat surface substantially irrespective of the unevenness remaining on the surface 25 of the diamond 20, so that the thickness of the coating 30 is varied in accordance with the region (or position) of the surface of the diamond 20.

Figure 12:
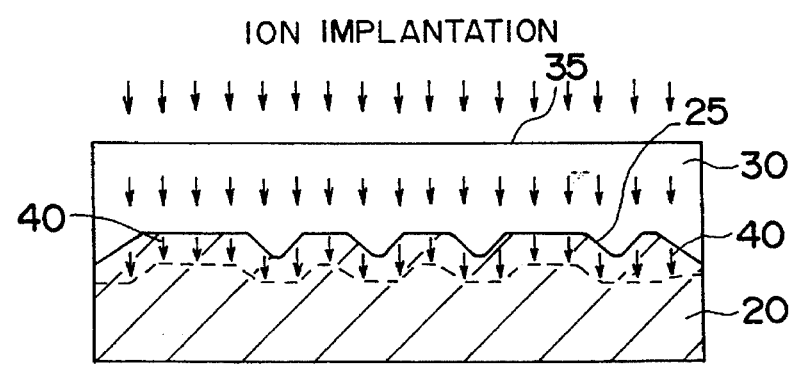

Subsequently, as shown in FIG. 12, ion implantation is conducted on the diamond 20 through the medium of the coating 30 having the flattened surface 35 from the side of the coating 30. Through this process, the injected ions 40 are passed through the coating 30, and then are uniformly introduced into the entire surface of the diamond 20.

Figure 13:
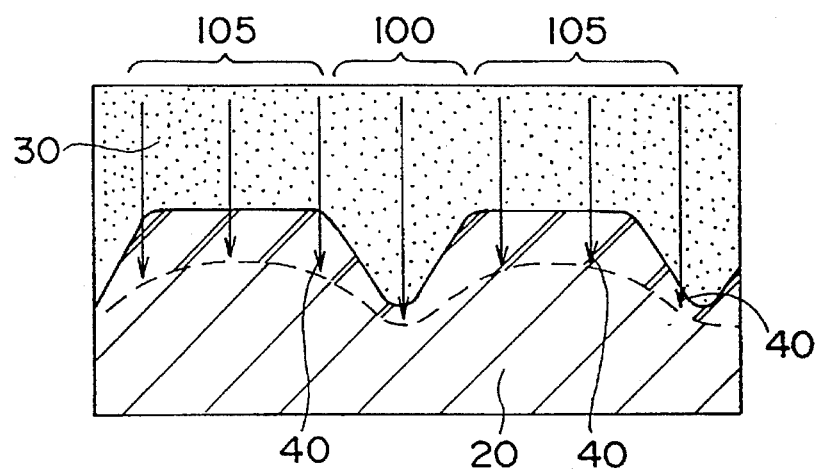

At this time, as shown in FIG. 13, the injected ions 40 passing through a region 100 of the coating 30 having a relatively large thickness are introduced into the diamond 20 so as to reach a relatively shallow portion in the interior of the diamond 20. On the other hand, the injected ions 40 passing through a region 105 of the coating 30 having a relatively small thickness are introduced into the diamond 20 so as to reach a relatively deep portion in the interior of the diamond 20.

Figure 14:
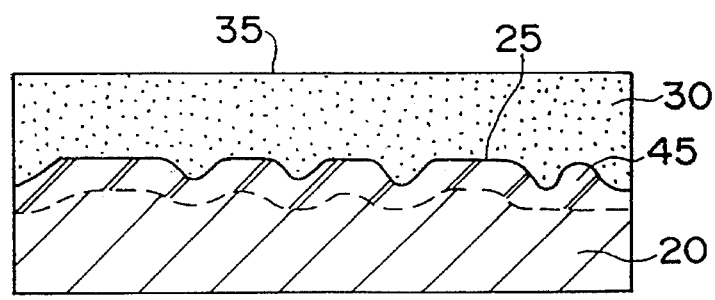

As shown in FIG. 14, in a portion of the diamond 20 into which the injected ions 40 are introduced, the crystal structure of diamond is destroyed by the impact of ion so that the diamond is denatured. For example, the diamond in such a portion is converted into an amorphous or graphite state.

Figure 15:
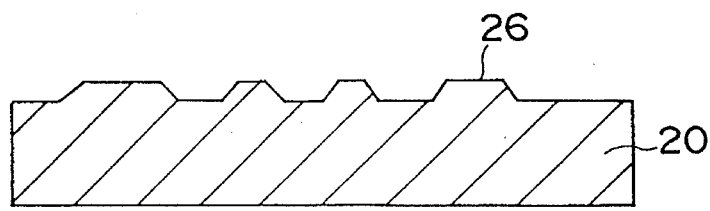

Subsequently, the entire coating 30 is removed from the surface 25 of the diamond 20, and the portions 45 which have been denatured by the ion implantation are removed. Through this process, as shown in FIG. 15, most of portions having a relatively large unevenness which have been present on the surface 25 of the diamond 20 are removed as the portions 45 comprising the denatured diamond, and a smooth surface 26 is exposed.

In this embodiment of the flattening method, in a case where a desired degree of flatness is not obtained on the surface 26 of the diamond 20 through one cycle of the flattening process, the flattening process as described above may be repeated one or more times to further flatten small unevenness remaining on the diamond surface. As a result, a diamond film having a smoother surface may easily be obtained.

Figure 16:
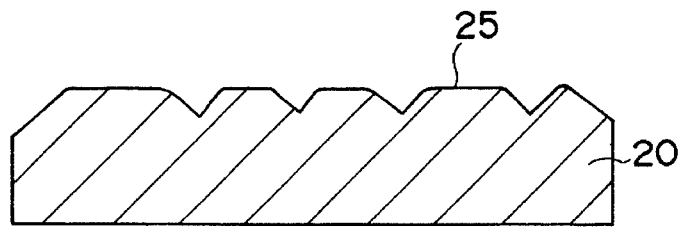
FIGS. 16–21 are schematic sectional views showing another embodiment of a method of flattening diamond according to the present invention, in the order of steps constituting the flattening method.

In such an embodiment of the diamond flattening method, as shown in FIG. 16, a coating 31 having a flat surface may be formed on a surface 25 of diamond 20 in such a manner that the stopping cross section of the diamond to the injected ions is made substantially equal to the stopping cross section of the coating to the injected ions, by adding a trace amount of a metal element to the material constituting the coating 31.

Figure 17:
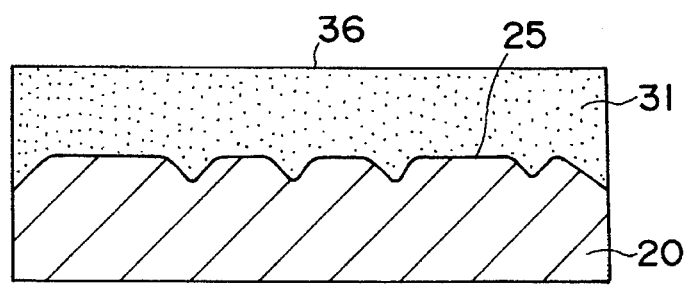

Through this process, as shown in FIG. 17, the unevenness present on the surface 25 of the diamond 20 is covered with the coating 31 and is filled with the material constituting the coating 31. As a result, a flat surface 36 of the coating 31 may be provided.

Figure 18:
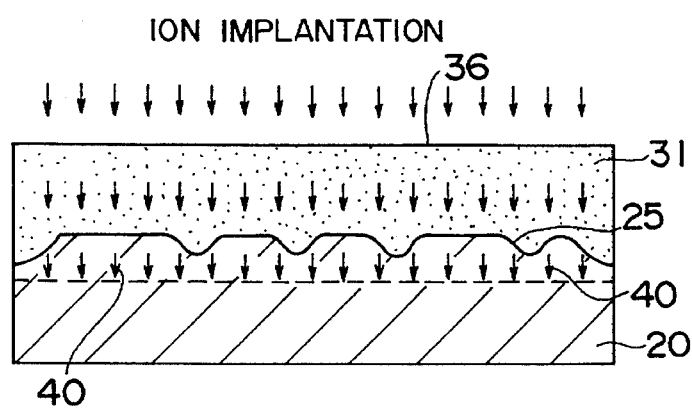

Subsequently, as shown in FIG. 18, the ion implantation is conducted on the diamond 20 through the medium of the coating 31 having the flattened surface 36. In this process, the injected ions 40 are passed through the coating 31, and then substantially uniformly introduced to the entire surface of the diamond 20.

Figure 19:
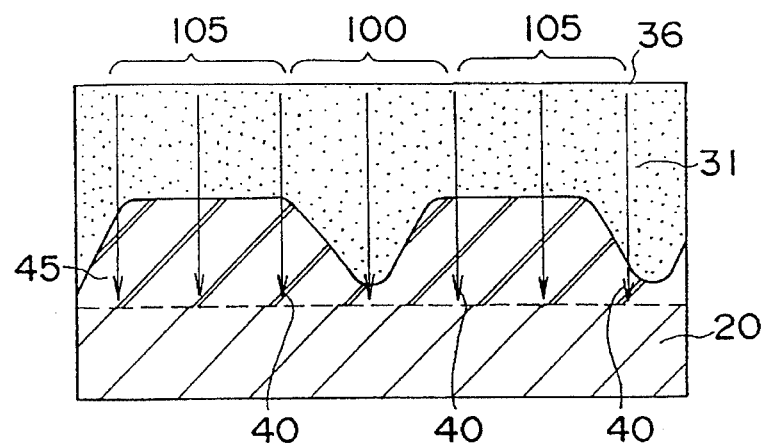

At this time, as shown in FIG. 19, the injected ions are efficiently introduced so as to reach substantially the same depth from the coating surface 36 in all the diamond regions, because the stopping cross section of the diamond 20 to the injected ions 40 is substantially equal to the stopping cross section of the coating 31 to the injected ions 40.

Figure 20:
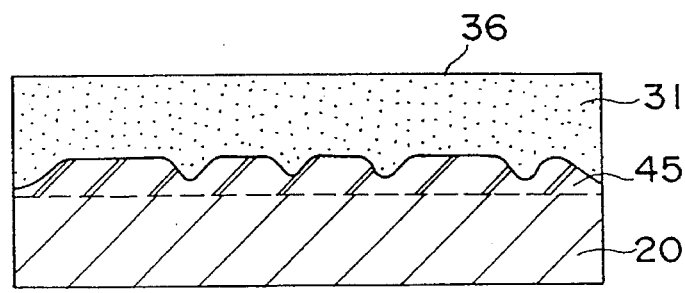

Through this process, as shown in FIG. 20, in portions 45 of the diamond to which the injected ions 40 have been introduced to substantially the same depth from the coating surface 36, the crystal structure of diamond is destroyed by the impact of ions to be denatured. As a result, the diamond in such portions is converted into an amorphous or graphite state.

Subsequently, the entirety of the coating 31 is removed from the surface of the diamond 20, and the portions 45 where the diamond has been denatured by the ion implantation are removed.

Figure 21:
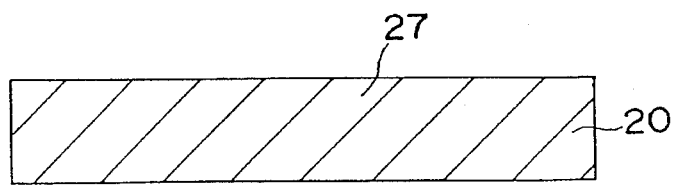

Through this process, as shown in FIG. 21, most of relatively large unevenness which have been present the surface 25 of the diamond 20 are removed as the diamond-denatured portions 45. As a result, diamond having a very flat surface 27 may be obtained through only cycle of the flattening process as described above.

Hereinbelow, the present invention will be described in more detail with reference to Examples.

EXAMPLES

Example 1

A polycrystal diamond film having a thickness of 10 μm which had been formed on a silicon substrate having a dimension of (3 inches×3 inches) was used as a substrate. When the average surface roughness $R_a$ of the surface of the diamond was measured, it was found to be 2000 Å (angstrom, i.e., 200 nm).

A coating agent $(X-Si-(OH)_n)$ (trade name: OCD produced by Tokyo Ohka Kogyo K. K.) mainly comprising an inorganic silicon compound was applied onto the above-mentioned diamond substrate by spin coating at 2000 rpm, and the resultant coating was then subjected to baking at 400° C. for 30 minutes thereby to form a coating layer on the diamond substrate. The thickness of the coating layer thus obtained was 6000 Å.

This substrate was then placed in a dry etching apparatus, and the substrate was etched by use of Ar gas (100%). The etching rate was 250 Å/min for both of the coating layer and the diamond, and the etching selectivity ratio between the coating layer and the diamond was 1:1. When the etching was conducted for 40 min., the coating layer and the unevenness of the diamond surface were etched thereby to provide a diamond film having a mirror-finished surface which had an average surface roughness $R_a$ of 100 Å.

On the thus obtained diamond substrate, a fine pattern was formed by use of a resist by means of an ultraviolet-ray reduction projection exposure apparatus. As a result, a pattern of 0.5 μm was obtained.

Example 2

A polycrystal diamond film having a thickness of 10 μm which had been formed on a silicon substrate having a dimension of (3 inches×3 inches) was used as a substrate. When the average surface roughness $R_a$ of the surface of the diamond was measured, it was found to be 2000 Å (angstrom).

A coating agent $(X-Si-(OH)_n)$ (trade name: OCD produced by Tokyo Ohka Kogyo K. K.) mainly comprising an inorganic silicon compound was applied onto the above-mentioned diamond substrate by spin coating at 2000 rpm, and the resultant coating was then subjected to baking at 400° C. for 30 minutes thereby to form a coating layer on the diamond substrate. The thickness of the coating layer thus obtained was 6000 Å.

This substrate was then placed in a dry etching apparatus, and the substrate was subjected to dry etching by use of a gas comprising Ar (95%) and $O_2$ (5%). The etching rate was 280 Å/min for the diamond and 250 Å/min for the coating layer, and the etching selectivity ratio between the coating layer and the diamond was 1:0.9. When the etching was conducted for 40 min., the coating layer and the unevenness of the diamond surface were etched, thereby to provide a diamond film having a mirror-finished surface which had an average surface roughness $R_a$ of 120 Å.

On the thus obtained diamond substrate, a fine pattern was formed by use of a resist by means of an ultraviolet-ray reduction projection exposure apparatus. As a result, a pattern of 0.5 μm was obtained.

Example 3

A polycrystal diamond film having a thickness of 10 μm which had been formed on a silicon substrate having a dimension of (3 inches×3 inches) was used as a substrate. When the average surface roughness $R_a$ of the surface of the diamond was measured, it was found to be 2000 Å (angstrom).

A polyimide mainly comprising an organic silicon compound was applied onto the above-mentioned diamond substrate by spin coating at 5000 rpm, and the resultant coating was then subjected to baking at 400° C. for 30 minutes thereby to form a coating layer on the diamond substrate. The thickness of the coating layer thus obtained was 6000 Å.

This substrate was then placed in a dry etching apparatus, and the substrate was etched by use of $CF_4$ gas. The etching rate was 200 Å/min for the diamond and 250 Å/min for the coating layer comprising polyimide, and the etching selectivity ratio between the coating layer and the diamond was 1:1.25. When the etching was conducted for 50 min., the coating layer and the unevenness of the diamond surface were etched thereby to provide a diamond film having a mirror-finished surface which had an average surface roughness $R_a$ of 120 Å.

On the thus obtained diamond substrate, a fine pattern was formed by use of a resist by means of an ultraviolet-ray reduction projection exposure apparatus. As a result, a pattern of 0.5 μm was obtained.

Example 4

As shown in FIG. 4, a coating agent $(X-Si-(OH)_n)$ (produced by Tokyo Ohka Kogyo K. K.) mainly comprising an inorganic silicon compound was dropped onto a diamond 10 having a dimension of (5 mm×5 mm) and having an average surface roughness of 2000 Å, and the resultant coating was then subjected to baking at 400° C. for 30 minutes, thereby to form a coating layer 11 having a dome-like shape on the diamond 10. The maximum thickness of the coating layer 11 thus obtained was 6000 Å.

The resultant diamond 10 was then placed in an etching apparatus, and was etched by use of a gas comprising Ar (95%) and $O_2$ (5%). The etching rate was 250 Å/min for both of the coating layer 11 and the diamond 10, and the etching selectivity ratio between the coating layer and the diamond was 1:1. When the etching was conducted for 40 min., the coating layer 11 and a portion of the surface of the diamond 10 were etched, thereby to provide a diamond lens 12 with a spherical surface (average surface roughness $R_a$=100 Å) as shown in FIG. 5.

Example 5

Figure 6:
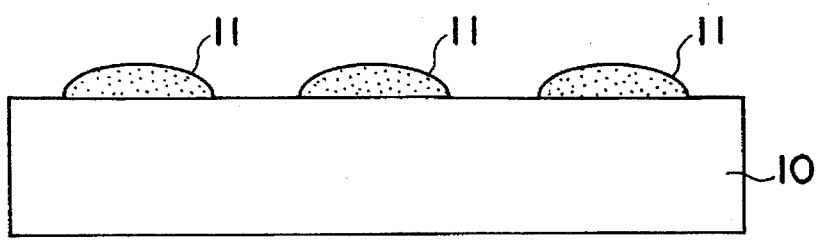
FIGS. 6 and 7 are schematic sectional views showing a further embodiment of a method of polishing diamond according to the present invention.

As shown in FIG. 6, a coating agent $(X-Si-(OH)_n)$ (produced by Tokyo Ohka Kogyo K. K.) mainly comprising an inorganic silicon compound was dropped onto a diamond 10 having a dimension of (5 mm×5 mm) and having an average surface roughness of 2000 Å so as to provide a plurality of coatings, and the resultant coatings were then subjected to baking at 400° C. for 30 minutes, thereby to form a plurality of coating layers 11 having a dome-like shape on the diamond 10. The maximum thickness of the coating layers 11 thus obtained was 1500 Å.

Figure 7:
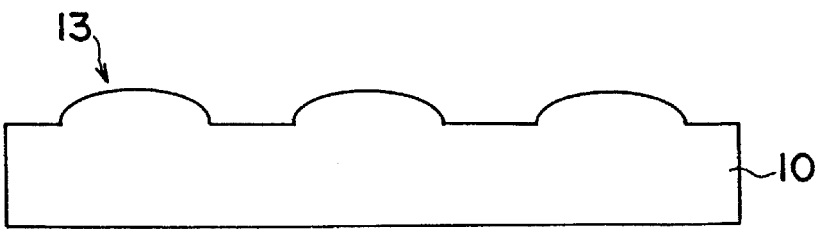

The resultant diamond 10 was then placed in an etching apparatus, and was etched by use of a gas comprising Ar (95%) and $O_2$ (5%). The etching rate was 250 Å/min for both of the coating layer 11 and the diamond 10, and the etching selectivity ratio between the coating layer and the diamond was 1:1. When the etching was conducted for 10 min., the coating layer 11 and a portion of the surface of the diamond 10 were etched, thereby to provide a diamond lens 13 with a plurality of spherical surfaces (average surface roughness $R_a$=100 Å) as shown in FIG. 7.

Example 6

As shown in FIG. 8, a coating agent $(X-Si-(OH)_n)$ mainly comprising an inorganic silicon compound was dropped onto a back surface of the diamond lens 12 obtained in Example 4, and the resultant coating was then subjected to baking at 400° C. for 30 minutes, thereby to form a coating layer 11 having a dome-like shape on the diamond 10. The maximum thickness of the coating layer 11 thus obtained was 6000 Å.

The resultant diamond 10 was then placed in an etching apparatus, and was etched by use of a mixture gas comprising Ar (95%) and $O_2$ (5%). The etching rate was 250 Å/min for both of the coating layer 11 and the diamond 10, and the etching selectivity ratio between the coating layer and the diamond was 1:1. When the etching was conducted for 40 min., the coating layer 11 and a portion of the back surface of the diamond lens 12 were etched, thereby to provide a diamond lens 14 with both-side spherical surfaces (average surface roughness $R_a$=100 Å) as shown in FIG. 9.

Example 7

Three kinds of substrates respectively comprising of the following kinds of diamond were prepared (STEP 1).
(1) Single crystal diamond (synthesized by ultra-high pressure synthesizing process) which had been subjected to polishing by using grade #20–#1000 (particle size: 10 μ–1000 μ) diamond powder.
(2) Single crystal diamond (synthesized by ultra-high pressure synthesizing process) which had been subjected to skiving polishing.
(3) Polycrystal diamond which had been formed on an Si substrate by vapor-phase synthesizing process.

The surface roughness of each of the above-mentioned substrates (1) to (3) was measured by a surface roughness tester (for example, a surface roughness tester produced by DEKTAK). The measurement results are shown in Table 1 (STEP 1) appearing hereinafter.

Then, an appropriate amount of a cyclized rubber-type photoresist agent (Trade name: OMR, produced by Tokyo Ohka Kogyo K. K.) was dropped onto the surface of each of the above-mentioned three kinds of substrates and applied thereonto by spin coating by means of a spinner. The photoresist agent was heated at 110° C. for 30 minutes under atmospheric air to dry the photoresist agent, whereby a photoresist film having a thickness of about 1 μm was formed (STEP 2). The surface roughness of each resist film thus obtained was measured by a surface roughness tester. The measurement results are shown in Table 1 (STEP 2) appearing hereinbelow.

Subsequently, by using an ion implantation apparatus, Ar ions were injected from the surface of the resist film formed on each of the above-mentioned substrates (1) to (3) in a dose amount of $10^{15}$ $cm^{-2}$ under an acceleration voltage of 50 keV, 500 keV, 1 MeV and 2 MeV (i.e., ion implantation in a dose amount of $10^{15}$ $cm^{-2}$ was conducted four times). Through this process, the Ar ions were injected to unevenness remaining on the surface of each of the substrates, and a portion which had been subjected to the ion implantation was converted into an amorphous or graphite state. After the ion implantation, the resist film was entirely removed from each of the substrates by use of a removing agent.

Then, the temperature of the substrate was set to 800° C., and the portion which had been converted into an amorphous or graphite state was exposed to plasma based on a gas containing hydrogen so that the amorphous or graphite portion was removed from each of the substrates, whereby the surface of diamond was flattened (STEP 3). The surface roughness of each substrate thus obtained was measured by a surface roughness tester. The measurement results are shown in Table 1 (STEP 3) appearing hereinafter.

TABLE 1

| | SURFACE ROUGHNESS (Rmax) | | |
|---|---|---|---|
| | STEP 1 | STEP 2 | STEP 3 |
| SAMPLE A | 500 Å | <20 Å | <200 Å |

TABLE 1-continued

| | SURFACE ROUGHNESS (Rmax) | | |
|---|---|---|---|
| | STEP 1 | STEP 2 | STEP 3 |
| SAMPLE B | 200 Å | <20 Å | 100 Å |
| SAMPLE C | 2000 Å | <100 Å | 500 Å |

*SAMPLE A: monocrystal diamond (synthesized by ultra-high pressure synthesizing method) polished with powder having a particle size of 100µ
*SAMPLE B: monocrystal diamond (synthesized by ultra-high pressure synthesizing method) polished by skiving polishing
*SAMPLE C: polycrystal diamond (synthesized by chemical vapor deposition (CVD) method)

As shown in the above Table 1, it was found that the flattening treatment as described above remarkably reduced the surface roughness of all the substrates (1) to (3). In other words, it was confirmed that marked flattening effect was provided by the flattening treatment according to the present invention.

Example 8

Each of the substrates (1) to (3) which had been subjected to one cycle of the flattening treatment as described in Example 7 was prepared (STEP 4). Accordingly, the surface roughness of each substrate as shown in Table 2 (STEP 4) appearing hereinafter was considered to be equal to that of each of the substrates as shown in the above Table 1 (STEP 3).

Subsequently, in the same manner as in Example 7, a photoresist film was formed on each substrate (STEP 5). The surface roughness of each photoresist film thus obtained was measured. The measurement results are shown in Table 2 (STEP 5) appearing hereinafter.

Then, by means of an ion implantation apparatus, Ar ions were injected from the surface of the resist film formed on each of the substrates (1) to (3) in a dose amount of $10^{15}$ $cm^{-2}$ under an acceleration voltage of 50 keV, 500 keV, 1 MeV and 2 MeV.

In the same manner as in Example 7, after the ion implantation, the resist film was entirely removed from each substrate, and the portion which had been converted into an amorphous or graphite state by the ion implantation was exposed to plasma based on a gas containing hydrogen to be removed from the surface of each substrate these portions, thereby to flatten the surface of diamond (STEP 6).

The surface roughness of each substrate thus obtained was measured by a surface roughness tester. The measurement results are shown in Table 2 (STEP 6) appearing hereinafter.

TABLE 2

| | SURFACE ROUGHNESS (Rmax) | | |
|---|---|---|---|
| | STEP 4 | STEP 5 | STEP 6 |
| SAMPLE A | 200 Å | <20 Å | <50 Å |
| SAMPLE B | 100 Å | <20 Å | 30 Å |
| SAMPLE C | 500 Å | <100 Å | 200 Å |

*SAMPLE A: monocrystal diamond (synthesized by ultra-high pressure synthesizing method) polished with powder having a particle size of 100µ
*SAMPLE B: monocrystal diamond (synthesized by ultra-high pressure synthesizing method) polished by skiving polishing
*SAMPLE C: polycrystal diamond (synthesized by chemical vapor deposition (CVD) method)

As shown in the above Table 2, it was found that when the flattening treatment as described above was repeated (total two cycles), the surface roughness of each substrate was further reduced as compared with that obtained by one cycle of the flattening process.

Particularly, in this example, when the substrate comprising polycrystal diamond having a surface roughness of 2000 Å was twice subjected to the flattening treatment, the surface roughness of the original substrate could be reduced to about one-tenth thereof. Accordingly, it was confirmed that the flattening effect was marked.

Example 9

Each of the substrates (1) to (3) which had been subjected to the flattening treatment as described in Example 7 was prepared (STEP 1). Accordingly, the surface roughness of each substrate as shown in Table 3 (STEP 1) appearing hereinafter was considered to be equal to that of each of the substrates as shown in the above Table 1 (STEP 1), and the surface roughness of the resist film formed on each substrate as shown in Table 3 (STEP 2) appearing hereinafter was considered to be equal to that of each of the substrates as shown in the above Table 1 (STEP 2).

Then, by means of an ion implantation apparatus, Ar ions were injected from the surface of the resist film formed on each of the substrates (1) to (3) in a dose amount of $10 \cdot cm^{-2}$ under an acceleration voltage of 50 keV, 500 keV, 1 MeV and 2 MeV.

After the ion implantation, the resist film was entirely removed from each substrate so that the surface of each substrate was exposed.

In this Example, the portion which had been converted into an amorphous or graphite state by the ion implantation was removed from the surface of each substrate by a wet etching process using chromic acid, instead of using plasma etching. In this Example, the portion which had been converted into an amorphous or graphite state was removed from the surface of each substrate by the above-mentioned wet etching process, thereby to flatten the surface of diamond (STEP 3).

The surface roughness of each substrate thus obtained was measured by a surface roughness tester. The measurement results are shown in Table 3 (STEP 3) appearing hereinafter.

TABLE 3

| | SURFACE ROUGHNESS (Rmax) | | |
|---|---|---|---|
| | STEP 4 | STEP 5 | STEP 6 |
| SAMPLE A | 500 Å | <20 Å | 250 Å |
| SAMPLE B | 200 Å | <20 Å | 150 Å |
| SAMPLE C | 2000 Å | <100 Å | 600 Å |

*SAMPLE A: monocrystal diamond (synthesized by ultra-high pressure synthesizing method) polished with powder having a particle size of 100µ
*SAMPLE B: monocrystal diamond (synthesized by ultra-high pressure synthesizing method) polished by skiving polishing
*SAMPLE C: polycrystal diamond (synthesized by CVD method)

As shown in the above Table 3, it was confirmed that when the flattening treatment was conducted by a wet etching process using chromic acid, the portion which had been converted into an amorphous or graphite state by ion implantation could efficiently be removed from the surface of each substrate, thereby to markedly reduce the surface roughness of each substrate.

Example 10

A substrate comprising polycrystal diamond which had been formed on an Si substrate by vapor-phase synthesizing process was subjected to flattening treatment in the same manner as in Example 7. In this example, in order to investigate the effect of the flattening treatment due to the addition of a metal element, on injected ions employed in the ion implantation, there was used a photoresist agent (Trade Name: OMR, produced by Tokyo Ohka Kogyo K. K.) to which each of Al, W, Mo, Fe and Au had been added in an amount of $10^{20}$ cm$^{-3}$ and homogeneously mixed.

In the same manner as in Example 7, one selected from the resist agents to which the above-mentioned metal elements had respectively been added and a resist agent to which no metal element had been added, was applied onto each substrate by spin coating by means of a spinner, thereby to form a resist film (STEP 2). The resist films were formed so that all of the surface roughnesses of the surfaces of the resultant resist films were not more than 100 Å on the basis of surface roughness measurement.

Then, by means of an ion implantation apparatus, Ar ions were injected from the surface of the resist film formed on each of the substrates in a dose amount of $10^{15}$ cm$^{-2}$ under an acceleration voltage of 50 keV, 500 keV, 1 MeV and 2 MeV. After the ion implantation, the resist film was entirely removed from each substrate, and the portion which had been converted into an amorphous or graphite state by the ion implantation was exposed to plasma based on a gas containing hydrogen to be removed from the surface of each substrate, thereby to flatten the surface of diamond (STEP 3).

The surface roughness of each substrate thus obtained was measured by a surface roughness tester. The measurement results are shown in Table 4 (STEP 3) appearing hereinafter.

TABLE 4

| FLATNESS | SURFACE ROUGHNESS (Rmax) | | |
|---|---|---|---|
| A.M.E. | STEP 1 | STEP 2 | STEP 3 |
| NO ADDITIVE | 2000 Å | <100 Å | 600 Å |
| Al ($10^{20}$/cm$^3$) | 2000 Å | <100 Å | 300 Å |
| W ($10^{20}$/cm$^3$) | 2000 Å | <100 Å | 100 Å |
| Mo ($10^{20}$/cm$^3$) | 2000 Å | <100 Å | 100 Å |
| Fe ($10^{20}$/cm$^3$) | 2000 Å | <100 Å | 70 Å |
| Au ($10^{20}$/cm$^3$) | 2000 Å | <100 Å | 50 Å |

*A.M.E.: Added Metal Element

As shown in the above Table 4, it is confirmed that when a resist agent to which a metal element had been added was used, the resultant surface roughness of the substrate could be reduced to a smaller value as compared with that obtained in the case of using a resist agent to which no metal element had been added. According to the present inventors' investigation, it was assumed that the reason for such a phenomenon was that the stopping cross section of the resist film to the injected Ar ions was made equal to the stopping cross section of each diamond substrate to the injected Ar ions, by homogeneously adding the metal element into the interior of the resist film,.

Example 11

In the same manner as in Example 10, a substrate comprising polycrystal diamond which had been formed on an Si substrate by vapor-phase synthesizing process was subjected to flattening treatment in the same manner as in Example 7.

In this example, however, in place of the formation of the resist film on the substrate, an SiO$_2$ film was formed on the substrate by using sol-gel process. Further, in this example, in order to investigate the flattening effect due to the addition of a metal element, a gel to which each of Al, W, Mo, Fe and Au had been added in an amount of $10^{20}$ cm$^{-3}$ and homogeneously mixed therewith was used.

First, each of SiO-type sols to which the above-mentioned metal element had been added and an SiO-type sol to which no metal element had been added, was applied onto each substrate by spin coating by means of a spinner. Then, according to sol-gel process, the above SiO-type sol on the substrate was heated to be hardened, thereby to form a gel layer comprising SiO$_2$ (STEP 2). The surface roughness of the surface of the SiO$_2$ layer thus obtained was measured. At this time, all of the SiO$_2$ layers were formed so that the surface rougnness thereof was not more than 100 Å.

Then, by means of an ion implantation apparatus, Ar ions were injected from the surface of the SiO$_2$ layer formed on each of the substrates in a dose amount of $10^{15}$ cm$^{-2}$ under an acceleration voltage of 50 keV, 500 keV, 1 MeV and 2 MeV. After the ion implantation, the SiO$_2$ layer was entirely removed from each substrate by a treatment using HF, and the surface of each substrate was exposed. Then, the portion which had been converted into an amorphous or graphite state by the ion implantation was exposed to plasma based on a gas containing hydrogen to be removed from the surface of each substrate, thereby to flatten the surface of diamond (STEP 3).

The surface roughness of each substrate thus obtained was measured by a surface roughness tester. The measurement results are shown in Table 5 (STEP 3) appearing hereinafter.

TABLE 5

| FLATNESS | SURFACE ROUGHNESS (Rmax) | | |
|---|---|---|---|
| A.M.E. | STEP 1 | STEP 2 | STEP 3 |
| NO ADDITIVE | 2000 Å | <100 Å | 200 Å |
| Al ($10^{20}$/cm$^3$) | 2000 Å | <100 Å | 100 Å |
| W ($10^{20}$/cm$^3$) | 2000 Å | <100 Å | 80 Å |
| Mo ($10^{20}$/cm$^3$) | 2000 Å | <100 Å | 70 Å |
| Fe ($10^{20}$/cm$^3$) | 2000 Å | <100 Å | 50 Å |
| Au ($10^{20}$/cm$^3$) | 2000 Å | <100 Å | 50 Å |

*A.M.E.: Added Metal element

As shown in the above Table 5, it was confirmed that when an SiO$_2$ layer was formed on a substrate according to a sol-gel process and flattening treatment was conducted, the resultant surface roughness of the substrate could be reduced to a very small value. In addition, it was also confirmed that when a sol agent to which a metal element had been added was used, the resultant surface roughness of the substrate could be reduced to a smaller value. According to the present inventors' investigation, it was assumed that the reason for such a phenomenon was that the stopping cross section of the SiO$_2$ layer to the injected Ar ions was made substantially equal to the stopping cross section of each diamond substrate to the injected Ar ions.

As described in the above Examples 10 and 11, it was found that in the case of a certain kind of ion element to be implanted under a certain ion implantation condition, when the kind of a metal element to be added to a resist material and the amount of addition thereof were appropriately be set, a substrate having a desired level of flatness could be obtained through only one cycle of the flattening treatment.

Example 12

In the same manner as in Example 10, a substrate comprising polycrystal diamond which had been formed on an Si substrate by vapor-phase synthesizing process was subjected to flattening treatment in the same manner as in Example 7.

In this example, however, ion implantation was conducted by using each of Ar, Ne, He, Al Xe and Cu ions.

In the same manner as in Example 7, a resist agent was applied onto each substrate by spin coating by means of a spinner, thereby to form a resist film (STEP 2). The resist films were formed so that all of the surface roughnesses of the surfaces of the resultant resist films were not more than 100 Å on the basis of surface roughness measurement.

Then, by means of an ion implantation apparatus, each of Ar, Ne, He, Al, Xe and Cu ions were injected from the surface of the resist film formed on each of the substrates in a dose amount of $10^{15}$ cm$^{-2}$ under an acceleration voltage of 50 keV, 500 keV, 1 MeV and 2 MeV. After the ion implantation, the resist film was entirely removed from each substrate, and the portion which had been converted into an amorphous or graphite state by the ion implantation was exposed to plasma based on a gas containing hydrogen to be removed from the surface of each substrate, thereby to flatten the surface of diamond (STEP 3).

The surface roughness of each substrate thus obtained was measured by a surface roughness tester. The measurement results are shown in Table 6 (STEP 3) appearing hereinafter.

TABLE 6

| FLATNESS | SURFACE ROUGHNESS (Rmax) | | |
|---|---|---|---|
| INJECTED ION | STEP 1 | STEP 2 | STEP 3 |
| Ar ion | 2000 Å | <100 Å | 500 Å |
| Ne ion | 2000 Å | <100 Å | 600 Å |
| He ion | 2000 Å | <100 Å | 700 Å |
| Al ion | 2000 Å | <100 Å | 300 Å |
| Xe ion | 2000 Å | <100 Å | 200 Å |
| Cu ion | 2000 Å | <100 Å | 250 Å |

As shown in the above Table 6, the surface roughness of the substrate could be remarkably reduced by using all of the kinds of ions, and the flattering effect in this example was confirmed.

As described hereinabove, according to an aspect of the present invention, there is provided a method of flattening diamond, comprising the steps of: forming a flat coating comprising a material different from diamond, on a surface of diamond having unevenness; and removing the coating and the unevenness of the surface of diamond by dry etching under a condition such that both of the coating and the diamond can be etched, thereby to smooth the surface of the diamond.

In the flattening method as described above, since the surface of a substrate can be flattened in a non-contact mode, unlike in the case of the conventional mechanical polishing process such as skiving polishing, surfaces of various kinds of diamond may desirably be subjected to mirror finishing and/or flattening substantially without restriction of various states of a substrate to be polished or flattened, such as material, degree of warp, area, and thickness of the substrate.

According to another aspect of the present invention, there is provided a method of polishing diamond, comprising the steps of: dropping a liquid coating agent comprising a material different from diamond on a surface of diamond having unevenness, and hardening the coating agent to form a coating having a spherical surface on the surface of the diamond; and removing the coating and the unevenness of the surface of diamond by dry etching under a condition such that both of the coating and the diamond can be etched, thereby to provide a spherical surface of diamond.

The above-mentioned polishing method may preferably applied to the polishing or flattening of diamond having a larger area, e.g., by employing a large-scale dry etching apparatus.

Further, the above-mentioned polishing method may provide a surface of diamond with excellent smoothness, which has never been obtained by the conventional mechanical polishing, and therefore the resultant surface of diamond can be subjected to ultrafine-scale microfabrication. In addition, according to the present invention, the polishing steps are considerably simplified as compared with those constituting the conventional mechanical polishing process, so that the cost can efficiently be reduced. In other words, the present invention may provide a polishing or fattening method which is also useful for industrial purpose.

Moreover, the above-mentioned polishing method according to the present invention may also provide a diamond lens which can transmit light in a wavelength range, i.e. , an ultraviolet wavelength region (a wavelength region of about 225 nm or below; light having such a wavelength cannot be transmitted through a lens comprising a material other than diamond), and has high thermal conductivity and high reliability. The polishing method according to the present invention is particularly preferably applicable to the formation of a micro lens.

According a further aspect of the present invention, there is provided a method of flattening diamond, comprising: a first step of forming a flat coating comprising a material different from diamond on a surface of diamond; a second step of subjecting the diamond to ion implantation through the medium of the coating to denature a portion of the diamond; and a third step of removing the coating and removing the denatured portion from the diamond.

Such a flattening method for diamond is applicable to the production of an electronic and/or optical elements or parts which are required to have a severer flatness (e.g., a flatness of 50 Å or below) such as radiator substrate for an LSI to be used for a high-output semiconductor laser, etc.

Many modifications of the present invention may be made without departing from the essential scope thereof. It should be understood that the present invention is not limited to the specific embodiments as described.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

What is claimed is:

1. A method of flattening diamond, comprising:

applying a fluid coating material comprising a material different from diamond onto a surface of diamond having unevenness to form a flat coating on the surface of diamond; and removing the coating and the unevenness of the surface of diamond by dry etching under a condition such that both of the coating and the diamond can be etched, thereby to smooth the surface of the diamond.

2. A method according to claim 1, wherein a liquid coating agent comprising the material different from diamond is dropped onto the surface of a diamond, and the coating is formed on the surface of the diamond by spin coating.

3. A method of polishing diamond, comprising:

dropping a liquid coating agent comprising a material different from diamond on a surface of diamond having unevenness, and hardening the coating agent to form a coating having a spherical surface on the surface of the diamond; and removing the coating and the unevenness of the surface of diamond by dry etching under a condition such that both of the coating and the diamond can be etched, thereby to provide a spherical surface of diamond.

4. A method of flattening diamond, comprising:

a first step of forming a flat coating comprising a material different from diamond on a surface of diamond;

a second step of subjecting the diamond to ion implantation through the coating to denature a portion of the diamond; and a third step of removing the coating and removing the denatured portion from the diamond.

5. A method according to claim 4, wherein the first, second and third steps are repeated in this order, after said third step.

6. A method according to claim 4, wherein the coating comprises a resist mainly comprising an organic material.

7. A method according to claim 4, wherein the coating is formed by using a sol-gel process.

8. A method according to claim 4, wherein the coating is formed so as to provide a ratio (B/A) satisfying $0.1 \leq B/A \leq 10$ between the stopping cross section (A) of the coating to the ions injected by the ion implantation B, and the stopping cross section (B) of the diamond to the ions injected by the ion implantation.

9. A method of polishing diamond, comprising:

dropping a liquid coating agent comprising a material different from diamond on a surface of diamond having unevenness, and hardening the coating agent to form a coating having a dome-like surface on the surface of the diamond; and removing the coating and the unevenness of the surface of diamond by dry etching under a condition such that both of the coating and the diamond can be etched, thereby to provide a dome-like surface of diamond.

10. A method of flattening diamond, comprising:

forming a flat coating mainly comprising an inorganic silicon compound, on a surface of diamond having unevenness; and removing the coating and the unevenness of the surface of diamond by dry etching using a gas comprising Ar under a condition such that both of the coating and the diamond can be etched, thereby to smooth the surface of the diamond.

11. A method according to claim 10, wherein the gas for dry etching further comprises oxygen.

12. A method of flattening diamond, comprising:

forming a flat coating mainly comprising an organic silicon compound, on a surface of diamond having unevenness; and removing the coating and the unevenness of the surface of diamond by dry etching using a gas comprising $CF_4$ under a condition such that both of the coating and the diamond can be etched, thereby to smooth the surface of the diamond.

13. A method of flattening diamond, comprising:

forming a flat coating mainly comprising a cyclized rubber-type photoresist, on a surface of diamond having unevenness; and injecting Ar ions from the surface of the photoresist coating to the surface of diamond;

removing the photoresist coating; and removing the unevenness of the surface of diamond by dry etching using $H_2$ plasma, thereby to smooth the surface of the diamond.

14. A method according to claim 1, wherein the surface of diamond after the flattening has a surface roughness of 120 Å or below in terms of $R_a$.

15. A method according to claim 1, wherein the fluid coating material is applied onto the surface of diamond by spin coating.

16. A method according to claim 1, wherein a coating material in a sol state comprising the material different from diamond is applied to the surface of diamond, and the coating is converted into a gel state to form the flat coating.

17. A method according to claim 16, wherein the coating material in a sol state is applied onto the surface of diamond by spin coating.

* * * * *